United States Patent [19]

McLyman et al.

[11] 4,276,588

[45] Jun. 30, 1981

[54] PUSH-PULL CONVERTER WITH ENERGY SAVING CIRCUIT FOR PROTECTING SWITCHING TRANSISTORS FROM PEAK POWER STRESS

[76] Inventors: W. T. McLyman, Lakewood, Calif.; Robert A. Frosch, Administrator of the National Aeronautics and Space Administration, with respect to an invention of W. T. McLyman

[21] Appl. No.: 51,276

[22] Filed: Jun. 22, 1979

[51] Int. Cl.³ .............................................. H02H 7/12
[52] U.S. Cl. ........................................ 363/56; 363/24
[58] Field of Search .................................. 363/22–26, 363/55–58, 131–134; 361/8, 13, 91

[56] References Cited

U.S. PATENT DOCUMENTS

| | | | |
|---|---|---|---|
| 2,802,149 | 8/1957 | Germer et al. | 361/13 |
| 3,305,756 | 2/1967 | Doss et al. | 363/23 |
| 3,311,809 | 3/1967 | Corey et al. | 363/135 |
| 3,349,315 | 10/1967 | Studtmann | 363/135 |
| 3,430,125 | 2/1969 | Povenmire et al. | 363/24 |
| 3,532,901 | 10/1970 | Hylten-Cavallius | 363/54 |
| 3,670,234 | 6/1972 | Joyce | 363/56 |
| 4,065,713 | 12/1977 | Pollmeier | 363/23 X |

*Primary Examiner*—William M. Shoop
*Assistant Examiner*—Peter S. Wong
*Attorney, Agent, or Firm*—Monte F. Mott; John R. Manning; Paul F. McCaul

[57] ABSTRACT

In a push-pull converter, switching transistors are protected from peak power stresses by a separate snubber circuit in parallel with each comprising a capacitor and an inductor in series, and a diode in parallel with the inductor. The diode is connected to conduct current of the same polarity as the base-emitter junction of the transistor so that energy stored in the capacitor while the transistor is switched off, to protect it against peak power stress, discharges through the inductor when the transistor is turned on, and after the capacitor is discharged the energy now stored in the inductor discharges through the diode. To return this energy to the power supply, or to utilize this energy in some external circuit, the inductor may be replaced by a transformer having its secondary winding connected to the power supply or to the external circuit.

3 Claims, 11 Drawing Figures

PUSH-PULL CONVERTER WITH ENERGY SAVING CIRCUIT FOR PROTECTING SWITCHING TRANSISTORS FROM PEAK POWER STRESS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435, 42 USC 2457).

BACKGROUND OF THE INVENTION

This invention relates to switching power converters of the push-pull type, and more particularly to an improved snubber circuit for safeguarding the switching transistors against peak stresses.

In a conventional push-pull power converter, the source of DC power is alternately connected to two sides of a center tapped primary winding in a transformer by two control transistors periodically switched on 180° out of phase. In a converter which incorporates output voltage regulation, the period that each control transistor is turned on is regulated through a pulse width modulator as a function of the output voltage. U.S. Pat. No. 3,670,234 discloses such a pulse width modulated voltage regulator for a driven power converter. Each of the control transistors is protected by a diode which conducts current in a direction opposite to the current through the control transistors to protect them against reverse current when they are turned off due to energy stored in the primary winding of the transformer. Such a technique for protecting a switching transistor having an inductive load has become quite conventional.

One of the problems encountered in the operation of such a push-pull regulating converter is that the presence of an inductive load on the switching transistors produces power peaking when the transistor that is conducting is switched off. This could result in overstressing the switching transistors. FIG. 1 illustrates a basic push-pull converter, and FIG. 2 illustrates the peak power of the switching transistor $Q_1$ or $Q_2$ which is the product of its collector current, $I_C$ and its collector-emitter voltage $V_{CE}$, at turn-off. This peaking results because the voltage across the off-going transistor must reach the level of the input voltage before it can be turned off and the load current begins to flow independent of the transistor being switched off.

In practical circuits, the transformer $T_1$ causes the collector-emitter voltage to be twice the level of the input voltage $E_{IN}$. This high voltage, $2E_{IN}$, and collector current, $I_C$, produce in the transistor being switched off a peak power point which may damage, or decrease the life of, the transistor. This undesirable situation has been handled by use of a "snubber" circuit consisting of a resistor or a capacitor as shown in respective U.S. Pat. Nos. 3,430,125 and 3,305,756, or with both a resistor $R_1$ and a capacitor $C_1$ as shown in FIG. 3. The curve shown in FIG. 4 indicates the change in parameters resulting from this snubber circuit. Peaking and the total energy which must be absorbed by the switching transistor are reduced. A disadvantage is that power is wasted in the snubber circuit. A better prior-art snubber circuit is shown in FIG. 5 in which the circulating load current is diverted through diodes $D_1$ and $D_2$ shunting resistors $R_{1a}$ and $R_{1b}$ to charge capacitors $C_{1a}$ and $C_{2b}$ as the voltage rises across the transistor during turn-off. Each diode provides a low impedance current path during turn-off and forces current through the current-limiting resistor during turn-on. This results in the somewhat better curve shown in FIG. 6. A disadvantage of these snubber circuits shown in FIG. 3 and FIG. 5 is that both require use of low dissipation type capacitors and resistors having fairly large power ratings, with that of FIG. 3 having a slight advantage in that fewer components are required. Both do reduce considerably the power dissipated in the transistors, at a small penalty of somewhat slower switching capability, but both waste power dissipated in the resistors. In addition, the wasted power produces heat which imposes an undesirable thermal load that must be taken care of, perhaps at some further cost in energy consumption. It would be desirable to provide a snubber circuit in which energy absorbed by the circuit is returned to the power supply instead of being dissipated in the circuit. That would both reduce thermal load and conserve energy in the power supply.

The energy dissipated by the prior art snubber circuits can be determined by calculating the energy transfer from the snubber capacitor during each switching cycle as $\frac{1}{2}CV^2$, and multiplying by the frequency of operation, f, as follows:

$$P_{avg} = fC(V^2/2)$$

Applying this equation to a power supply system in which four 400 watt power supplies are paralleled, each having an input varying from 200 to 400 volts and an operating frequency of 10 kHz, and in which transistor collector current $I_c$ is 5 amperes, with a minimum operating voltage of 200, a changing voltage $\Delta t = 0.5 \times 10^{-6}$, the value of C becomes $$C = (I_c \Delta t / \Delta V) mfd$$

Substituting values:

$$C = \frac{(5)(0.5 \times 10^{-6})}{200}$$

and $$C = 0.0125 \, mfd$$

The average power dissipated in each side (phase) by the resistor is:

$$P_{avg} = fC(V^2/2)$$

$$P_{avg} = (10^4)(0.0125 \times 10^{-6})(400)^2/2$$

$$P_{avg} = 10 \text{ watts}$$

The loss of 20 watts per module for the four modules amounts to 80 watts. While this is only 5% of the total of 1600 watts, the heat load must be thermally accounted for and rejected. Any improvement which minimizes the thermal load and increases the efficiency of the system by recovering and conserving much of this wasted energy is therefore of interest.

SUMMARY OF THE INVENTION

In accordance with the present invention, an improved snubber circuit for switching transistors which alternately connect a DC power supply across a center tap of a transformer winding and the opposite ends of the transformer winding consists of a separate circuit for each transistor comprised of a capacitor, a diode and an inductor, with one plate of the capacitor connected to the collector of the transistor and the other plate connected through the diode to the emitter of the transistor. The polarity of conduction through the diode is the same as the base-emitter junction of the transistor. The energy stored in the capacitor when the transistor is turned off discharges through the inductor when the transistor is turned on, thus transferring the energy stored into the inductor. Once the capacitor is thus discharged, the inductor discharges its stored energy through the diode. Very little energy is lost in the very low resistance of the forward biased diode and the low resistance of the inductor. If this energy is to be returned to the power supply, or used in an external circuit, the inductor is replaced by a transformer having a load in its secondary winding connected to the power supply or external circuit.

The novel features of the invention are set forth with particularity in the appended claims. The invention will best be understood from the following description when read in conjunction with the accompanying drawings.

DESCRIPTION OF PREFERRED EMBODIMENTS

Figure 1:
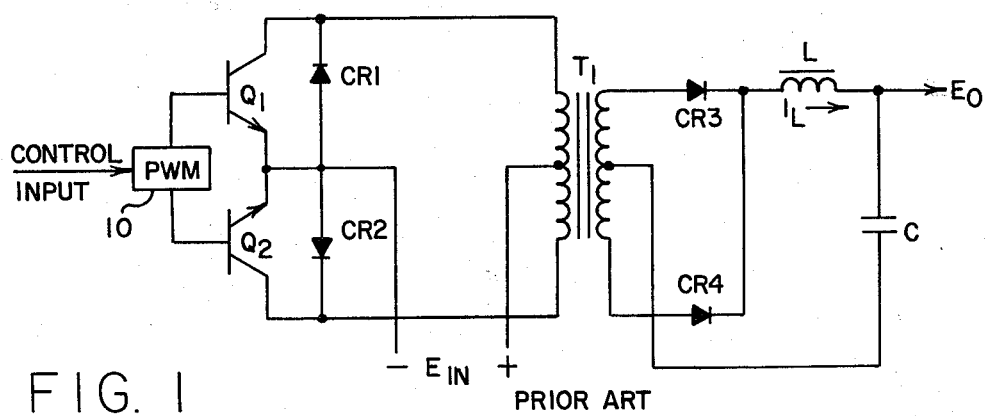
FIG. 1 is a circuit diagram of the basic prior-art push-pull buck power converter referred to hereinbefore.
Figure 2:
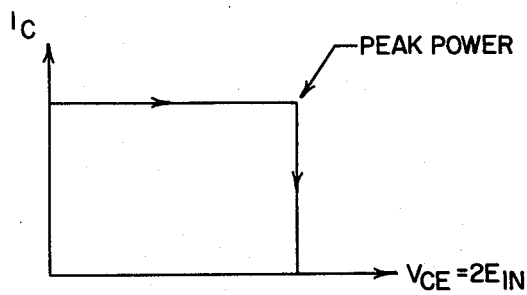
FIG. 2 is a graph referred to hereinbefore of collector current versus collector-to-emitter voltage of a switching transistor in the converter of FIG. 1.

As noted hereinbefore, the basic push-pull buck converter of FIG. 1 has diodes CR1 and CR2 for protection of transistors $Q_1$ and $Q_2$ against reverse current flow due to the inductive load comprised of transformer T1 as the transistors $Q_1$ and $Q_2$ are alternately turned on by a pulse-width modulator 10 which may receive the output voltage $E_0$ from a filter comprised of an inductor L and a capacitor C in order to regulate the output voltage to a load. Diodes CR3 and CR4 in the secondary circuit rectify the output of the transformer for full wave rectification in the power converter. FIG. 2 illustrates the peak power produced across each of the transistors $Q_1$ and $Q_2$ as they are switched from the on condition to the off condition. This peak power overstresses the transistors thereby severely limiting their life span, and sometimes causing a very premature failure.

Figure 4:
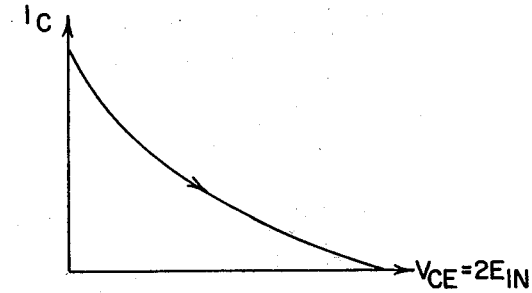
FIG. 4 is a graph referred to hereinbefore of collector current versus collector-to-emitter voltage of a switching transistor in the converter of FIG. 3.
Figure 3:
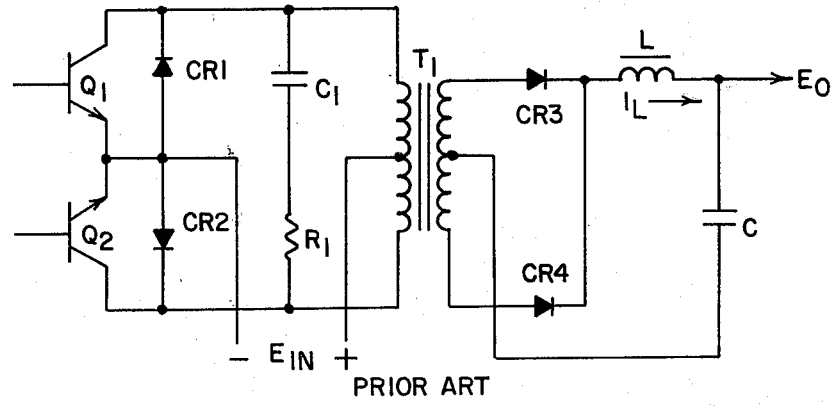
FIG. 3 is a circuit diagram of the basic converter with a prior art snubber circuit referred hereinbefore.
Figure 5:
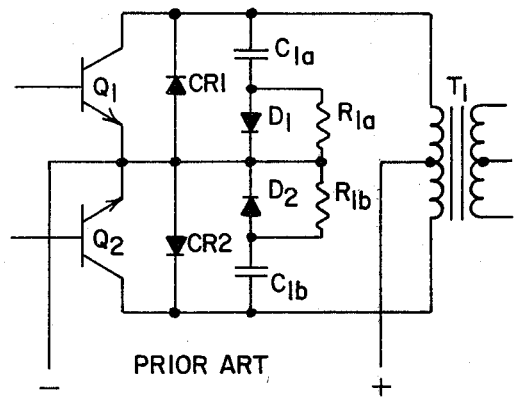
FIG. 5 is a circuit diagram of an improved snubber circuit in the prior art referred to hereinbefore.
Figure 6:
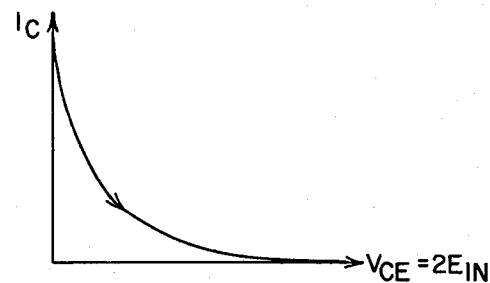
FIG. 6 is a graph referred to hereinbefore of collector current versus collector-to-emitter voltage of a switching transistor in the converter of FIG. 5.

To reduce the peak power of the circuit a snubber circuit consisting of capacitor $C_1$ and resistor R1 is added to the basic push-pull buck converter of FIG. 1. FIG. 4 illustrates in a graph of collector current versus collector-emitter voltage of a switching transistor to show how the peak power to which the transistor is subjected has been very significantly reduced. To further reduce the peak power, the snubber circuit of FIG. 3 has, in the past, been modified as shown in FIG. 5 wherein the capacitor $C_1$ has been divided into two parts $C_{1a}$ and $C_{1b}$, and the resistor has been divided into two parts $R_{1a}$ and $R_{1b}$. The junction between these resistors $R_{1a}$ and $R_{1b}$ stand connected to the return current path to the power supply, and diodes $D_1$ and $D_2$ are connected in parallel with the resistors $R_{1a}$ and $R_{1b}$.

In operation, while a transistor is turned off, such as the transistor $Q_1$, the associated capacitor $C_{1a}$ is charged through the diode $D_1$. When the transistor is turned on, the charge stored in the capacitor $C_{1a}$ discharges through the transistor $Q_1$ so that when that transistor is again turned off, the capacitor $C_{1a}$ can again be charged, thereby providing a path for current while the transistor is being turned off, that is to say while collector current is still flowing through it. In that manner, the capacitor functions as a current sink to significantly reduce the collector current of the transistor while it is being switched off in order to significantly reduce the peak power to which the transistor is being subjected as it is switched from the on state to the off state.

Figure 7:
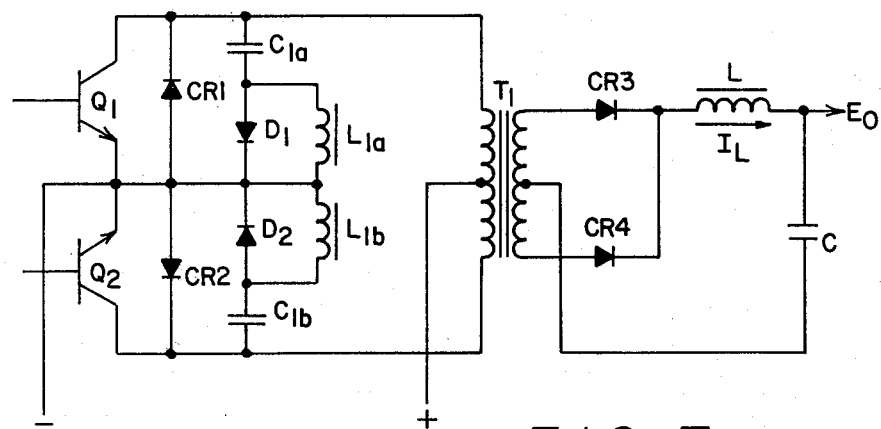
FIG. 7 is a circuit diagram of a converter with an improved snubber circuit in accordance with the present invention.
Figure 8:
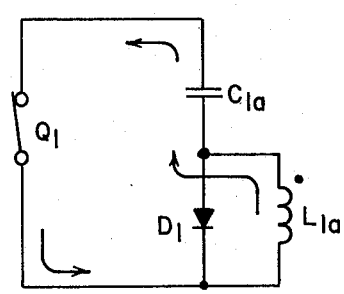
FIG. 8 is a simplified circuit illustrating part of the operation of the circuit of FIG. 7.
Figure 9:
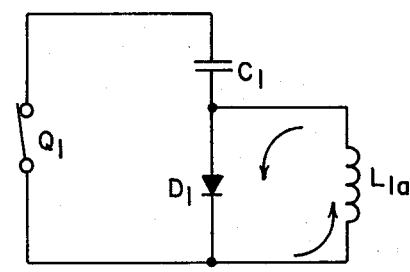
FIG. 9 is a simplified circuit illustrating another part of the operation of the circuit of FIG. 7.
Figure 10:
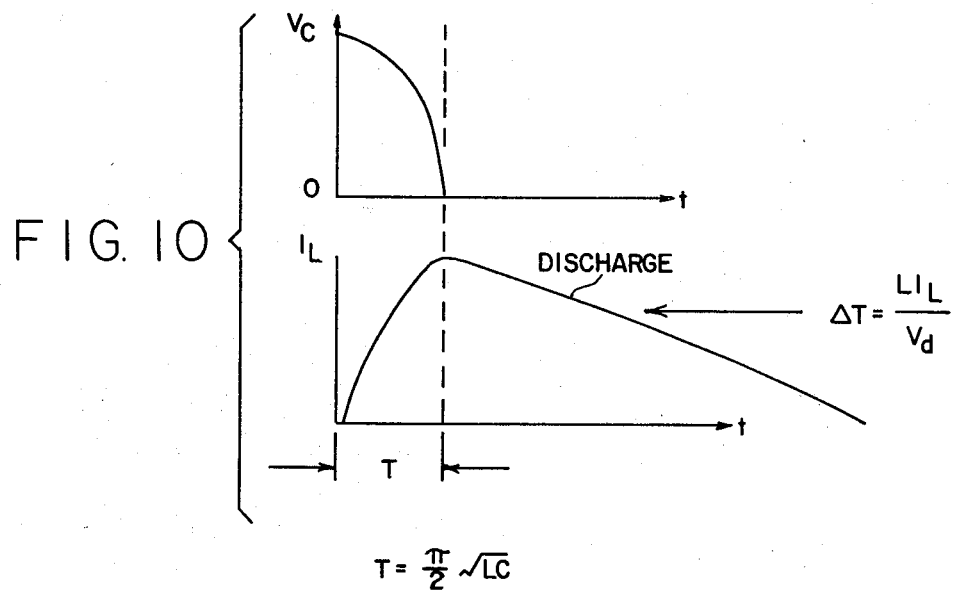
FIG. 10 is a graph of inductor current and capacitor voltage in the operation of the circuit shown as FIGS. 8 and 9.
Figure 11:
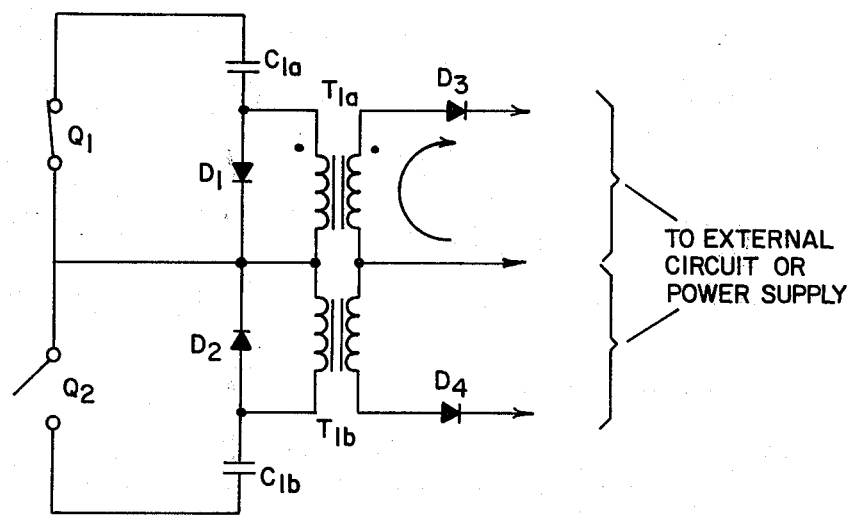
FIG. 11 illustrates a modification of the invention illustrated in FIG. 7 to utilize power stored in the inductor or to return it to the power supply.

The improved snubber circuit of the prior art shown in FIG. 5 has the disadvantage noted hereinbefore that power is being dissipated in the resistors $R_{1a}$ and $R_{1b}$. To significantly reduce this power loss, the resistors $R_{1a}$ and $R_{1b}$ are substituted by inductors $L_{1a}$ and $L_{1b}$, as shown in FIG. 7. While a switching transistor is turned off, such as the transistor $Q_1$, the associated capacitor $C_{1a}$ is charged as before. When the transistor is then turned on, the capacitor $C_{1a}$ discharges through the transistor drawing current through the inductor $L_{1a}$ as shown in FIG. 8. When the capacitor $C_{1a}$ has discharged so that it no longer produces current through the transistor, the energy stored in the inductor is discharged through the diode $D_1$ as shown in FIG. 9. The energy stored in the inductor is thus discharged through the low impedance of the diode and the inductor. If the energy discharged from the inductor is instead coupled out through a transformer to a load, or back to the power supply, as shown in FIG. 11, much lower heat is generated in the converter circuit, and thus reduces the energy that might otherwise be required to dissipate heat in the converter circuit. FIG. 10 illustrates how the voltage of the capacitor reduces to zero in a period T during which the transistor is turned on, thus increasing the inductor current which after the turn-on period T continues as a discharge current that decreases in amplitude over a period of time while the transistor is turned on.

The energy stored in the inductor $L_{1a}$ can be returned to the power supply, or it can be utilized in an external circuit, by replacing the inductor $L_{1a}$ with a transformer $T_{1b}$ as shown in FIG. 11. Since current now present in the secondary winding of the transformer $T_1$ for return to the power supply, or $D_3$ may be included in the secondary circuit of the transformer $T_{1a}$ with a filter similar to the filter shown in FIG. 7. The inductor $L_{1b}$ is then also substituted with a transformer $T_{1b}$ which, through a rectifying diode $D_4$, is then also connected to the output filter. In that manner, the secondary windings of the transformer $T_{1a}$ and $T_{1b}$ provide transfer of the recovered energy through the diodes $D_3$ and $D_4$ to a load which may be the same load as the main converter circuit shown in FIG. 7, in which case the filter elements may be the same, i.e., the diodes $D_3$ and $D_4$ may be feeding into the same filter as the diodes CR3 and CR4 of the main circuit. The turns ratio of the transformers is selected so that when the diodes $D_3$ and $D_4$ conduct, the reflected voltage appearing across the primary is not high enough to turn on the diodes $D_1$ and $D_2$. In that regard, it should be noted that in place of one diode, such as the diode $D_1$, two or more diodes may be connected in series in order to increase the reflected voltage which can be tolerated across the primary winding of the transformer.

Although particular embodiments of the invention have been described and illustrated herein, it is recognized that modifications and equivalents may readily occur to those skilled in this art. Consequently, it is intended that the claims be interpreted to cover such modifications and equivalents.

What is claimed is:

1. In a circuit having a switching power transistor driving an inductive load, said transistor being switched on and off, an improved means for protecting said transistor from peak power stresses comprising a capacitor and an inductor connected in a series circuit that is connected between the collector and the emitter of said transistor, said inductor being a primary winding of a transformer, and a diode in parallel with said primary winding, said diode being connected to conduct forward current to charge said capacitor while said transistor is turned off, whereby energy stored in said capacitor is automatically transferred to said primary winding when said transistor is turned on, and once said capacitor is discharged, energy stored in said primary winding is discharged through said diode, whereby energy discharged from said capacitor may be transferred to an external circuit, load or power supply for the circuit through said transformer.

2. In a converter having at least one power transistor being turned on and off to periodically conduct current from a DC source through a primary winding of a transformer, an improved snubber circuit connected in parallel with said transistor to said DC source comprising a capacitor and an inductor connected in series, said inductor being a primary winding of a second transformer having its secondary winding connected through a rectification diode to an external circuit, load or power supply, and a diode connected in parallel with said inductor, said diode being oriented to conduct in the same direction as the base-emitter junction of said transistor.

3. An improved snubber circuit for switching a pair of transistors used to alternately connect a DC power supply to first and second halves of a center tapped primary winding of a transformer for DC-to-DC conversion, wherein one transistor has a collector connected to one end of the primary winding of said center tapped transformer, the other transistor has a collector connected to the other end of the primary winding of said center tapped transformer, and both transistors have base-emitter junctions with their emitters connected to said power supply for return current conducted from the center tap of said primary winding through the two halves thereof alternately as said transistors are turned on and off, said improved snubber circuit comprising two parts, one part in parallel with one transistor, and one part in parallel with the other transistor, each part comprising a capacitor having one terminal connected to the collector of one of said transistors and the other terminal connected to the emitter of said one of said transistors through an inductance, and a diode connected in parallel with said inductance between the emitter of said one of said transistors and said other terminal of said capacitor, wherein said inductance is a primary winding of a transformer for utilization in its secondary circuit power recovered from said inductance, or for return of power to said power supply, said diode being connected for current conduction of the same polarity as current through the base-emitter junction of said transistor, whereby energy stored in said capacitor while said transistor is turned off discharges through said inductance, and energy thus transferred and stored in said inductance is thereafter discharged through said diode in parallel with said inductance.

* * * * *